(12) United States Patent
Kasajima

(10) Patent No.: US 8,193,805 B2
(45) Date of Patent: Jun. 5, 2012

(54) MAGNETIC SENSOR

(75) Inventor: Tamon Kasajima, Hong Kong (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 487 days.

(21) Appl. No.: 12/453,182

(22) Filed: Apr. 30, 2009

(65) Prior Publication Data

US 2009/0284254 A1 Nov. 19, 2009

(30) Foreign Application Priority Data

May 14, 2008 (JP) .................................. 2008-126621

(51) Int. Cl.
*G01B 7/14* (2006.01)
(52) U.S. Cl. .............................. 324/207.21; 324/207.19
(58) Field of Classification Search ............... 324/207.2, 324/207.18, 207.19, 207.23, 219, 207.21, 324/443, 526, 648, 651, 673, 610, 657, 666, 324/680, 706, 725
See application file for complete search history.

(56) References Cited

U.S. PATENT DOCUMENTS

| 5,477,143 | A  | * | 12/1995 | Wu ........................... 324/207.21 |
| 7,116,100 | B1 | * | 10/2006 | Mock et al. .............. 324/207.25 |
| 7,839,141 | B2 | * | 11/2010 | Werth et al. .............. 324/207.21 |

OTHER PUBLICATIONS

NVE Corporation (US), "NVE Corporation GMR Sensor Catalog", URL:http://www.nve.com/Downloads/catalog.pdf, Mar. 17, 2008, p. 7.

* cited by examiner

*Primary Examiner* — Huy Q Phan
*Assistant Examiner* — Alesa Allgood
(74) *Attorney, Agent, or Firm* — Nixon & Vanderhye P.C.

(57) ABSTRACT

A magnetic sensor capable of detecting a magnetic field with high sensitivity is provided. The magnetic sensor includes a bridge circuit having a plurality of magneto resistive effect elements connected with each other, and is capable of detecting a differential voltage between predetermined connecting points. The magneto resistive effect elements output resistance values which vary in accordance with a direction of a magnetic field to be input, and are arranged such that fixed magnetization directions of all magneto resistive effect elements are in the same direction. Further, a magnetic body which changes the direction of the magnetic field to be input to the magneto resistive effect elements is also provided in the vicinity of the bridge circuit.

15 Claims, 15 Drawing Sheets

MAGNETIC SENSOR

BACKGROUND

This application claims priority to Japanese Application No. 2008-126621 filed May 14, 2008, the entire contents of which are hereby incorporated by reference.

1. Technical Field

The present invention relates to magnetic sensors, and in particular, to magnetic sensors using magneto resistive effect elements.

2. Related Art

Magnetic sensors capable of detecting changes in magnetic fields have been developed as measurement devices and used in various applications including ammeters and magnetic encoders. The NVE CORPORATION GMR Sensor Catalog (Non-Patent Document 1) discloses examples of such magnetic sensors, in which GMR (Giant Magneto Resistive effect) elements are used as elements for detecting changes in magnetic fields. A GMR element is an element in which a resistance value to be output varies depending on input magnetism. According to the output resistance value, a detected change in a magnetic field can be measured.

As shown in Non-Patent Document 1, a specific exemplary configuration of a magnetic sensor using GMR elements includes four GMR elements arranged on a substrate and constituting a bridge circuit. By detecting a differential voltage in the circuit, changes in resistance values of the GMR elements due to changes in the object magnetic field are detected. With this configuration, a sensor having high sensitivity in changes in a magnetic field can be realized.

More specifically, the magnetic sensor disclosed in Non-Patent Document 1 includes a GMR chip (magnetic field detection chip) using spin-valve type GMR elements as elements for detecting changes in a magnetic field, in which resistance values to be output vary corresponding to the direction of the magnetic field to be input. Each GMR element is fixedly magnetized in a predetermined direction on one surface thereof so as to be able to detect a magnetic field in a predetermined direction. In order to reduce the size of the GMR chip and variations in the respective resistance values of the GMR elements, four GMR elements constituting a bridge circuit are formed a single GMR chip. As such, the fixed magnetization directions of all four GMR elements are the same.

In the case of detecting a magnetic field in one direction using a GMR chip having such a bridge circuit, as changes in the magnetic field are almost the same in all GMR elements, changes in the resistance values output from the respective GMR elements according to the changes in the magnetic field are almost the same. As such, it is difficult to detect a differential voltage in the bridge circuit. In order to solve this problem, in Non-Patent Document 1, two of the four GMR elements are covered with a NiFe film. As the GMR elements covered with the NiFe film cannot detect changes in the magnetic field, the resistance values of the other two GMR elements vary in accordance with the changes in the magnetic field. Thereby, a differential voltage can be detected in the bridge circuit, so that changes in the magnetic field can be detected.

[Non-Patent Document 1] NVE CORPORATION (US), "NVE CORPORATION GMR Sensor Catalog", [online], P. 7, [Searched on Mar. 17, 2008], the Internet <URL:http://www.nve.com/Downloads/catalog.pdf>

However, the art disclosed in Non-Patent Document 1 involves a problem that as the resistance values of the two GMR elements, among the GMR elements constituting the bridge circuit, covered with the NiFe film do not vary, a large differential voltage is not output, so that the magnetic field cannot be detected with high accuracy.

On the other hand, in the case of using a bridge circuit including GMR elements as described above in order to detect a magnetic field in one direction with high accuracy, it is necessary to separately arrange the GMR elements in two and two, for example, so that the GMR elements have different fixed magnetization directions. However, in the configuration of the GMR elements being separated, a bridge circuit is constituted of a plurality of chips, causing errors in the resistance values of respective GMR elements. As such, as an offset voltage is caused even when the magnetic field is zero, measurement cannot be performed with high accuracy. Further, to form a bridge circuit, connecting points and wires are required for connecting GMR elements formed on a plurality of chips. This increases the resistance, whereby the offset voltage may further be increased. Furthermore, if the bridge circuit is constituted of a plurality of chips, it is necessary to include connecting points, wires, and substrates as described above, causing a problem that the size of the sensor cannot be reduced.

Further, if the offset voltage is large when the magnetic field is zero, the temperature characteristics of the offset voltage deteriorate. This means, although the resistance values of the four GMR elements increase or decrease in accordance with rise or drop of the temperature, variations therein become larger because the GMR elements are separately provided as described above. Consequently, a large offset drift is caused, so that it is more difficult to detect the magnetic field with high accuracy.

Further, in the case where the GMR elements are separately provided, they cannot be arranged densely. With this configuration, as variations are caused in the film thickness of the GMR elements, variations in the resistance of the respective GMR elements become large, whereby the offset voltage becomes larger, as the case described above. Further, when the GMR elements are separately provided, a pad must be formed for each element and the element area becomes larger, so that it is difficult to reduce the size of the chip. This causes a problem that the number of chips which can be manufactured in the manufacturing steps decreases, so that the product price increases.

SUMMARY

It is therefore an object of the present invention to provide a magnetic sensor capable of improving accuracy in detecting a magnetic field while realizing size reduction and cost reduction which have been the problems in this field of art.

A magnetic sensor, which is one embodiment of the present invention, includes a bridge circuit having a plurality of magneto resistive effect elements connected with each other, and is capable of detecting a differential voltage between predetermined connecting points. The magneto resistive effect elements output resistance values which vary in accordance with a direction of a magnetic field to be input, and are arranged such that fixed magnetization directions of the magneto resistive effect elements are in the same direction. The magnetic sensor further includes a magnetic body arranged in the vicinity of the bridge circuit. The magnetic body changes the direction of the magnetic field to be input to the magneto resistive effect elements.

The magnetic body is made of a soft magnetic material, for example. It is preferable that the magneto resistive effect elements and the magnetic body are arranged on the same straight line along the fixed magnetization direction of the magneto resistive effect elements.

Specifically, the bridge circuit includes four magneto resistive effect elements. Further, two element forming regions, in each of which a pair of the magneto resistive effect elements not adjacently-connected with each other in the bridge circuit are formed in almost the same area, are provided corresponding to respective pairs of the magneto resistive effect elements, and the magnetic body is arranged between the two element forming regions. The magnetic body may be disposed on a plane where the magneto resistive effect elements are formed.

Further, additional magnetic bodies may be respectively provided on an opposite side of one of the element forming regions with respect to the other element forming region, and on an opposite side of the other element forming region with respect to the one element forming region. Those magnetic bodies may be arranged below the plane where the magneto resistive effect elements are formed.

According to the present invention, as the bridge circuit is constituted of a plurality of magneto resistive effect elements arranged such that the fixed magnetization direction thereof are in the same direction, the bridge circuit can be formed on a single chip, whereby variations in resistance values of the respective magneto resistive effect elements can be reduced. Further, in the present invention, a magnetic body is arranged in the vicinity of the bridge circuit. With this magnetic body, the direction of the magnetic field existing around the magnetic sensor with respect to the magneto resistive effect elements having the same fixed magnetization direction is changed. Thereby, the external magnetic field in one direction can be changed into different directions between the magneto resistive effect elements, in accordance with the arrangement of the magnetic body. For example, two element forming regions, in each of which a pair of the magneto resistive effect elements not adjacently-connected with each other in the bridge circuit are formed in almost the same area, are provided corresponding to respective pairs of the magneto resistive effect elements, and the magnetic body is arranged such that the magnetic field enters one region in the fixed magnetization direction and enters the other region in the opposite direction. With this configuration, as a large differential voltage can be output from the bridge circuit, accuracy of detecting the magnetic field in one direction can be improved.

In this case, as the GMR elements constituting the bridge circuit can be formed on a single chip, variations in resistance values thereof can be reduced, so that accuracy of detecting the magnetic field can be improved by suppressing the offset voltage. In addition, as the bridge circuit is formed on a single chip, the size of the chip can be reduced as a whole, whereby the manufacturing efficiency of the chip is improved and the sensor cost can also be reduced.

A measurement device, which is another embodiment of the present invention, is configured to include the above-described magnetic sensor. The measurement device may also include a magnetic field generation unit for generating a magnetic filed which perpendicularly enters a plane where the magneto resistive effect elements provided to the magnetic sensor are formed.

An ammeter, which is still another embodiment of the present invention, includes a magnetic core in an almost ring shape having a gap formed by cutting the magnetic core, and a conductor penetrating through almost the center of the magnetic core, and measures electric current flowing through the conductor by detecting a magnetic field generated in the magnetic core by the electric current. The ammeter is configured to include the above-described magnetic sensor arranged in the gap formed in the magnetic core. The magnetic sensor is preferably arranged such that a plane where the magneto resistive effect elements provided to the magnetic sensor are formed faces a cross section constituting the gap of the magnetic core.

A rotation angle sensor, which is still another embodiment of the present invention, includes a magnetic field generation unit for generating a magnetic field in a predetermined direction and the above-described magnetic sensor. The magnetic field generation unit is rotatably provided. The magnetic sensor is provided in the rotational periphery of the magnetic field generation unit such that a radius direction of the rotational circle of the magnetic field generation unit and a fixed magnetization direction of the magneto resistive effect elements coincide with each other. The magnetic field generation unit is in an almost cylindrical shape, and a half of an outer peripheral face of the magneto resistive generation unit may be formed to have a north pole. Further, at least two of the magnetic sensors may be arranged in the rotational periphery of the magnetic field generation unit so as to have an angle of 90 degrees between the magnetic sensors from the rotational center of the magnetic field generation unit.

Further, a method of manufacturing a magnetic sensor, which is another embodiment of the present invention, includes forming a bridge circuit including a plurality of magneto resistive effect elements connected with each other. The bridge circuit is capable of detecting a differential voltage between predetermined connecting points. The magneto resistive effect elements output resistance values which vary in accordance with a direction of a magnetic field to be input, and are arranged such that fixed magnetization direction of the magneto resistive effect elements are in the same direction. Then, the method further includes arranging a magnetic body in the vicinity of the bridge circuit. The magnetic body changes the direction of the magnetic field to be input to the magneto resistive effect elements.

When forming the bridge circuit, the bridge circuit is constituted of four magneto resistive effect elements, and two element forming regions, in each of which a pair of the magneto resistive effect elements not adjacently-connected with each other in the bridge circuit are formed in almost the same area, are provided corresponding to respective pairs of the magneto resistive effect elements. Further, when arranging the magnetic body, the magnetic body is arranged between the two element forming regions.

Further, when arranging the magnetic body, additional magnetic bodies may be respectively arranged on an opposite side of one of the element forming regions with respect to the other element forming region, and on an opposite side of the other element forming region with respect to the one element forming region.

According to the present invention which is configured and works as described above, as a large differential voltage is output from the bridge circuit in accordance with a change in the magnetic field in one direction, accuracy of detecting the magnetic field can be improved. In particular, as the bridge circuit can be formed on a single chip, advantages such as variations in resistance values of the respective magneto resistive effect elements are suppressed, accuracy of detecting the magnetic field is improved, and size and costs of the magnetic sensor are reduced, can be achieved.

DETAILED DESCRIPTION

Specific configurations of the present invention will be described by means of embodiments. Hereinafter, first to third embodiments describe magnetic sensors according to the present invention, and fourth and fifth embodiments describe various measurement devices using magnetic sensors.

<First Embodiment>

Figure 1A:
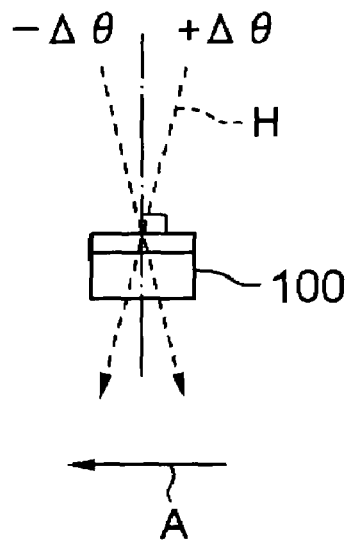
FIGS. 1A and 1B are diagrams illustrating characteristics of a GMR element.
Figure 1B:
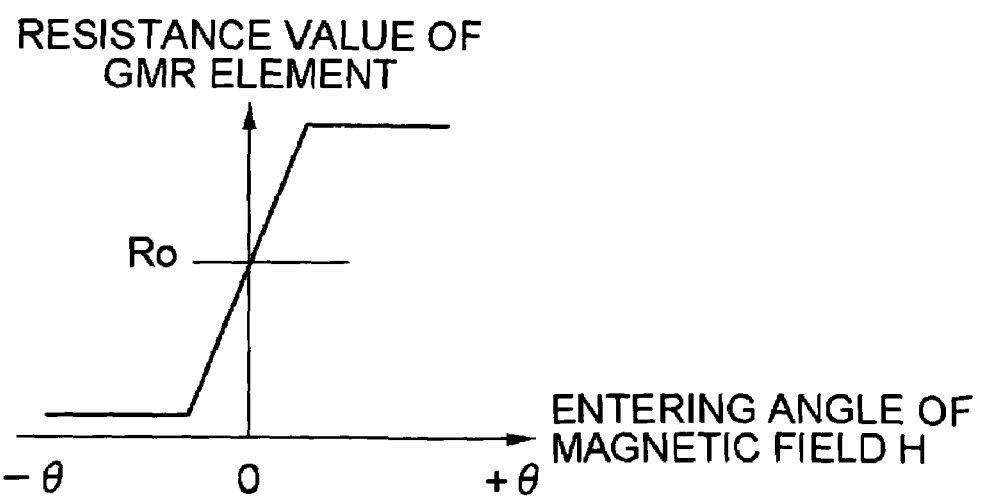
Figure 6:
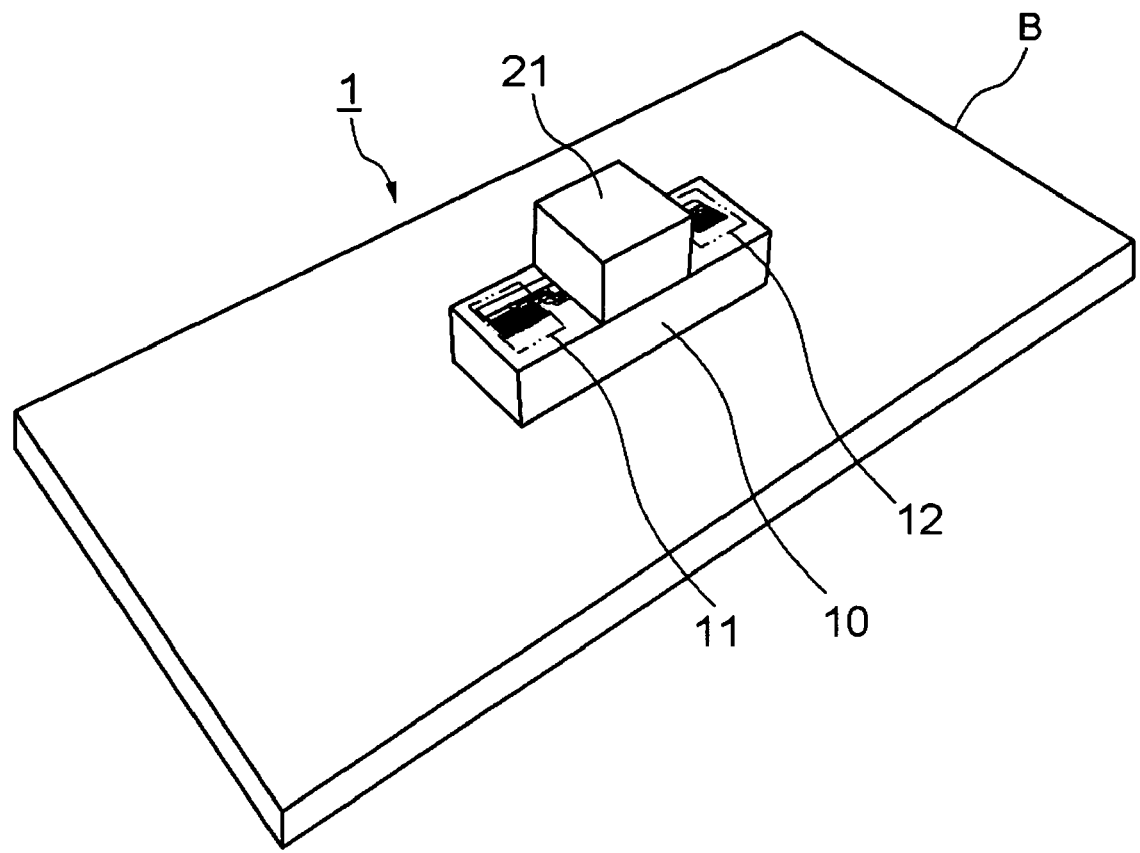
FIG. 6 is a diagram showing the configuration of a magnetic sensor according to a first embodiment.
Figure 7:
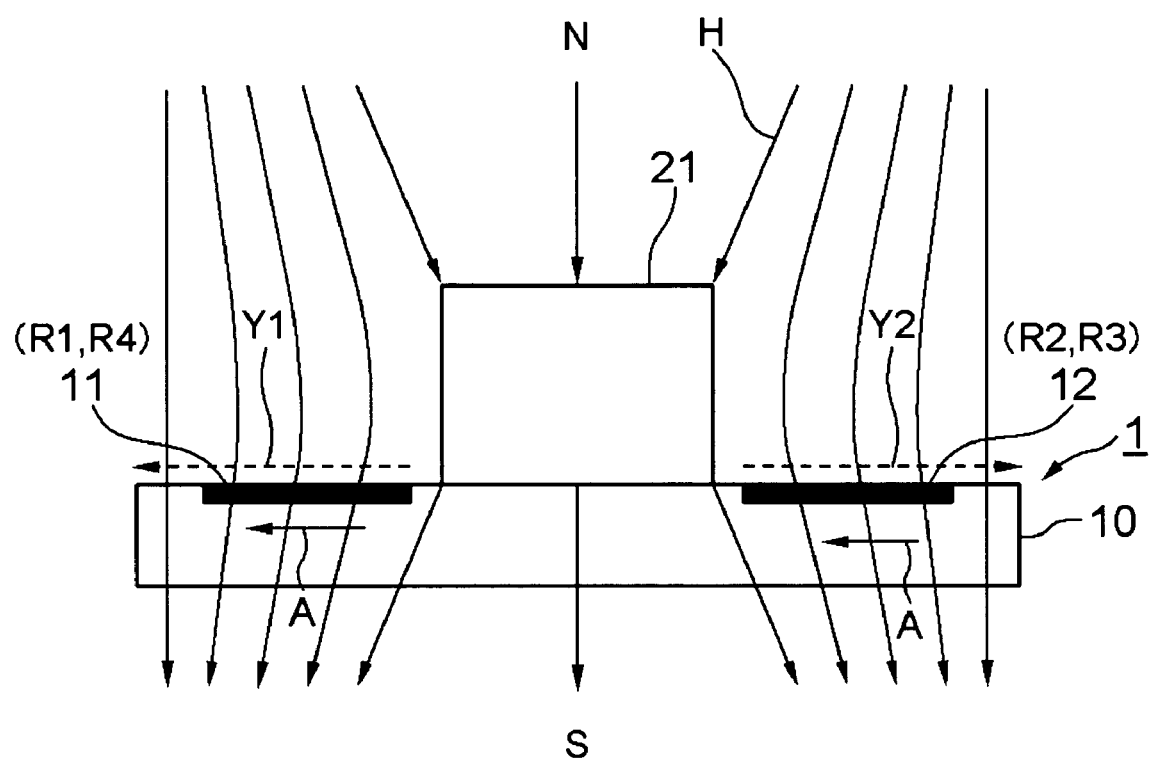
FIG. 7 is a diagram showing a state of a magnetic field relative to the magnetic sensor of the first embodiment.

A first embodiment of the present invention will be described with reference to FIGS. 1A to 7. FIGS. 1A and 1B are diagrams illustrating characteristics of a GMR element. FIGS. 2 to 5 show an example of a GMR chip. FIGS. 6 and 7 are diagrams showing an example of a magnetic sensor according to the present embodiment.

First, characteristics of a GMR element used in the present invention will be described with reference to FIGS. 1A and 1B. The GMR element is a spin-valve type GMR element in which a resistance value to be output varies according to the direction of a magnetic field to be input. FIG. 1A shows a relationship between an entering angle of a magnetic field H relative to the GMR element and a resistance value.

In the example shown in FIG. 1A, a GMR chip 100 is configured such that GMR elements are formed on the upper surface thereof. These GMR elements are fixedly magnetized in a direction of an arrow A so as to be able to detect a magnetic field in the arrow A direction.

In FIG. 1A, each GMR element is arranged in the magnetic field H which perpendicularly enters the surface of the chip on which the GMR element is formed. In this case, a resistance value of the GMR element is "Ro", as shown in FIG. 1B. On the other hand, when the direction of the magnetic field inclines, the entering angle of the magnetic field H relative to the surface on which the GMR element is formed inclines from the perpendicular direction by an angle of $-\Delta\theta$ ($\Delta$ (delta): used for representing the amount of change) or $+\Delta\theta$, as shown by the dotted lines in FIG. 1A. As the GMR element is fixedly magnetized in one direction as described above, the direction of the magnetic field is changed in that direction, whereby the GMR resistance value varies as shown in FIG. 1B. In this way, the GMR element has a characteristic that when the resistance value is set to be Ro in a state where the entering direction of the magnetic field is perpendicular, the resistance value significantly varies particularly when the direction of the magnetic field H inclines by a minute angle.

[Configuration]

Figure 2:
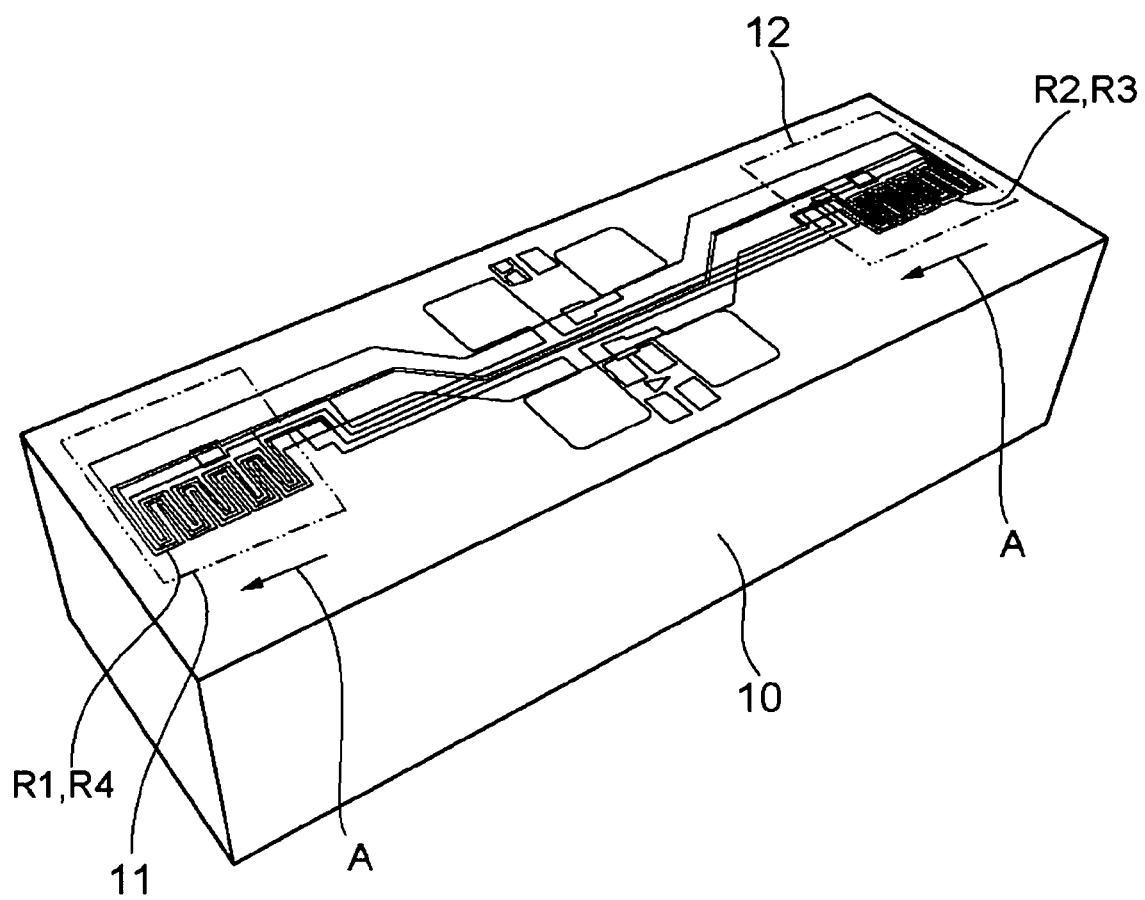
FIG. 2 is a diagram showing the configuration of a GMR chip.
Figure 3:
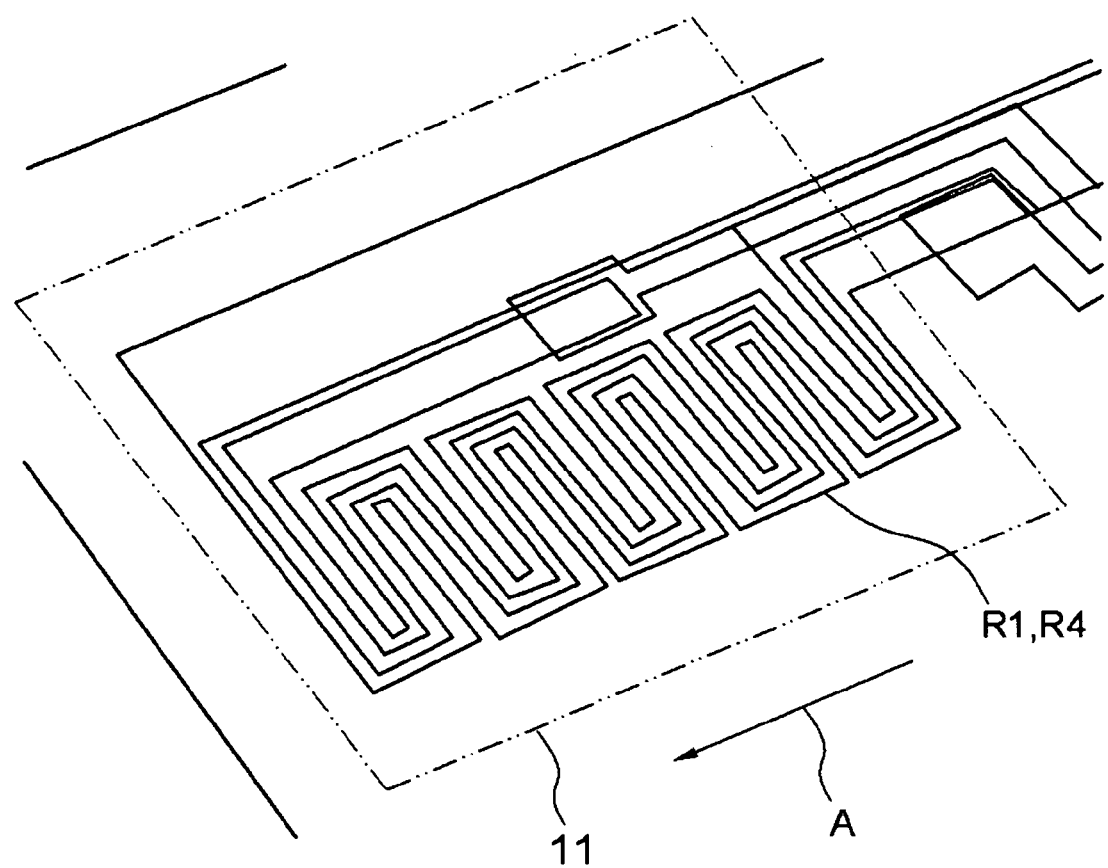
FIG. 3 is an enlarged view showing a part of a GMR chip.
Figure 4:
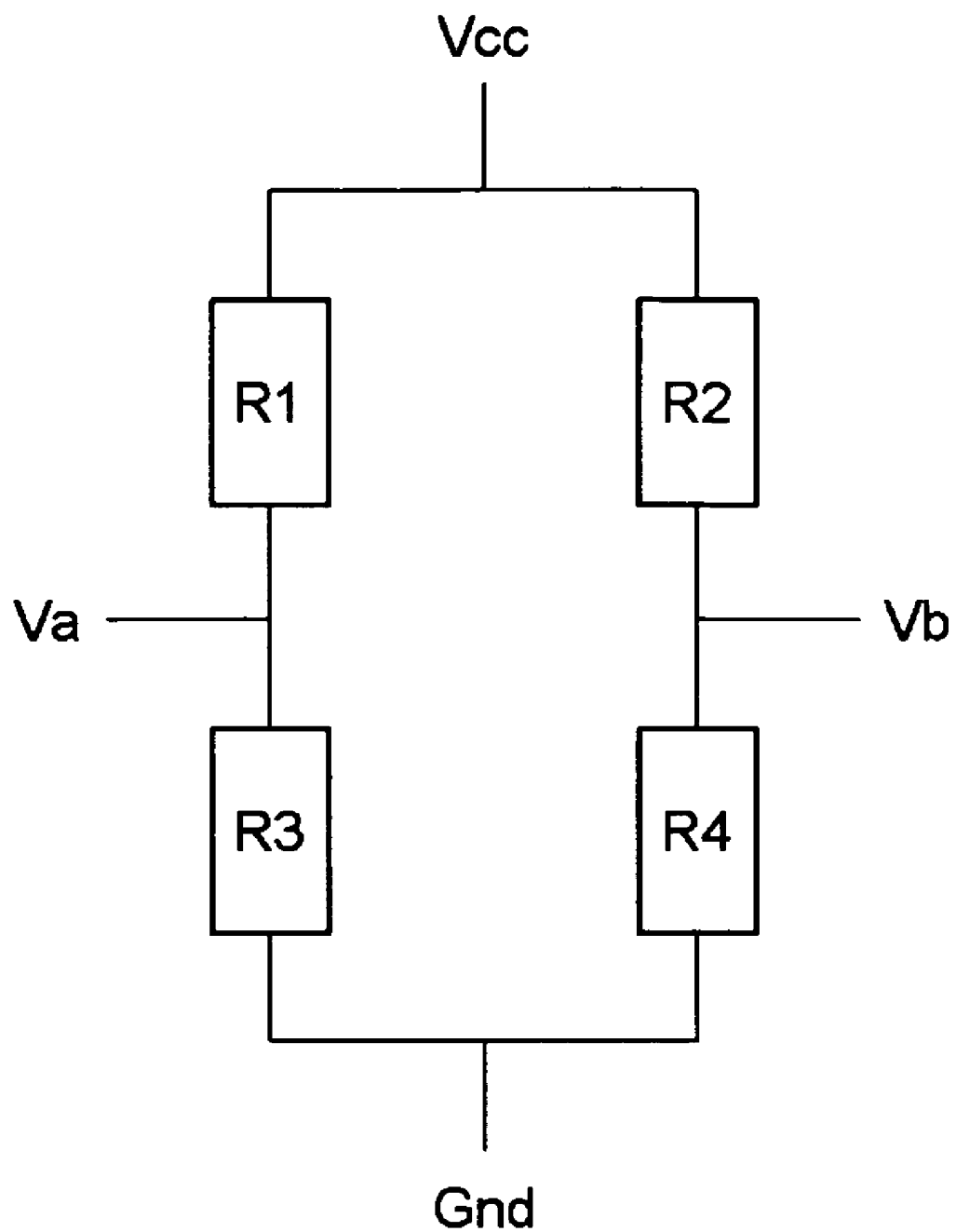
FIG. 4 is a diagram showing a bridge circuit constituted of GMR elements formed on a GMR chip.

Next, the configuration of the GMR chip 10 used in a magnetic sensor 1 of the present embodiment will be described with reference to FIGS. 2 to 5. As shown in FIG. 2, the GMR chip 10 is formed in an almost rectangular solid shape, having four GMR elements R1, R2, R3, and R4 formed on one surface (upper surface) thereof. The GMR elements R1, R2, R3, and R4 are connected with each other and constitute a bridge circuit, as shown in FIG. 4. Specifically, the GMR elements R1 and R3 and the GMR elements R2 and R4 are respectively connected in series, and the series-connected GMR elements R1 and R3 and the series-connected GMR elements R2 and R4 are connected in parallel with respect to the power source to thereby constitute a closed circuit. This configuration enables to detect a differential voltage between a connecting point Va between the GMR elements R1 and R3 and a connecting point Vb between the GMR elements R2 and R4. It is assumed that the bridge circuit has been formed on the GMR chip 10 such that a differential voltage can be detected as described above.

In the present embodiment, a pair of GMR elements R1 and R4, which are not adjacently-connected with each other in the bridge circuit shown in FIG. 4, are formed in almost the same area in an element forming region 11, as shown in FIG. 2. Similarly, another pair of GMR elements R2 and R3, which are not adjacently-connected with each other in the bridge circuit, are formed in almost the same area in an element forming region 12. Referring to FIG. 3 showing an enlarged view of the element forming region 11, the two GMR elements R1 and R4 are formed in a meander shape (zigzag) in the almost same area. Similarly, the two GMR elements R2 and R3 in the element forming region 12 are also formed in a meander shape in the almost same area. Further, all GMR elements R1, R2, R3, and R4 are fixedly magnetized in the same direction, that is, the arrow A direction.

As described above, the respective element forming regions 11 and 12, in which the pairs of GMR elements (R1 and R4, and R2 and R3) are formed, are distant from each other. For example, as shown in FIG. 2, the respective element forming regions 11 and 12 are formed near the both ends in a long side direction of the GMR chip 10, that is, near the both ends in the fixed magnetization direction of the GMR elements. The respective element forming regions 11 and 12 are formed with a space between them where a magnetic body 21 described later can be disposed.

Figure 5:
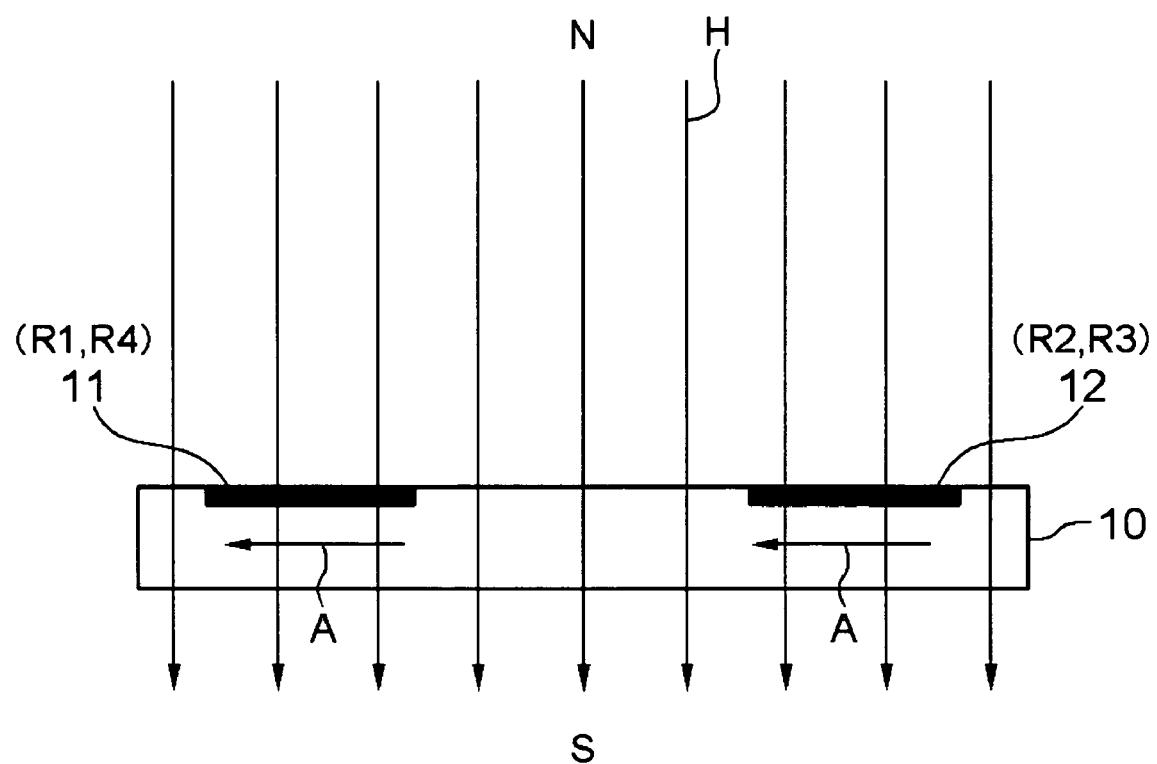
FIG. 5 is a diagram showing a state of a magnetic field relative to a GMR chip.

FIG. 5 is a view showing the GMR chip 10 seen from a side, illustrating a state where the GMR chip 10 is arranged in the magnetic field H. As shown in FIG. 5, when the direction of the magnetic field H is changed from a perpendicular direction relative to the fixed magnetization direction A of the GMR elements R1, R2, R3, and R4, the direction is changed by the almost same angle relative to all GMR elements R1, R2, R3, and R4. Consequently, resistance values of all GMR elements R1, R2, R3, and R4 vary by the almost same value.

In this configuration, however, it is difficult to detect a differential voltage between the connecting points Va and Vb in the bridge circuit shown in FIG. 4 constituted of these GMR elements R1, R2, R3, and R4.

Meanwhile, the magnetic sensor 1 of the present invention includes a magnetic body 21 for changing the direction of the magnetic field H to be input to the GMR elements R1, R2, R3, and R4, in the vicinity of the bridge circuit formed on the GMR chip 10. Specifically, the magnetic sensor 1 of the present embodiment has the GMR chip 10 on a substrate B, and also has the magnetic body 21 disposed between the respective element forming regions 11 and 12 of the bridge circuit formed on the GMR chip 10. It should be noted that the magnetic body 21 is made of soft ferrite (soft magnetic material), for example. As described above, the magnetic body 21 and the GMR elements R1, R2, R3, and R4 are arranged on the same straight line along the fixed magnetization direction A of the GMR elements. It should be noted that the position of the magnetic body 21 is not limited to this position. For example, the magnetic body 21 may be disposed not on the GMR chip 10 but above the GMR chip 10, and is not necessarily disposed between the respective element forming regions 11 and 12.

[Operation]

Next, operation of the magnetic sensor 1 having the above-described configuration will be described with reference to FIG. 7. FIG. 7 shows a case where the magnetic sensor 1 is arranged in the magnetic field H, the direction of which is almost perpendicular to the surface on which the GMR elements R1, R2, R3, and R4 are formed, as the example shown in FIG. 5. In the present embodiment, the magnetic field H is drawn to the magnetic body 21 in the part from above the magnetic body 21 to almost the center of the magnetic body 21, and the magnetic field H is bent in a direction away from the magnetic body 21 in the part from almost the center of the magnetic body 21 to the lower part of the magnetic body 21 where the respective element forming regions 11 and 12 are formed, as shown in FIG. 7. As such, the magnetic fields H in opposite directions enter the respective element forming region 11 and 12 (GMR elements R1 and R4 and GMR elements R2 and R3) located over the magnetic body 21. Specifically, as shown by the arrows Y1 and Y2 of doted lines in FIG. 7, the magnetic field H in which the direction thereof is changed to the same direction as the fixed magnetization direction A enters the GMR elements R1 and R4 in the element forming region 11, and the magnetic field H in which the direction thereof is changed to a direction opposite to the fixed magnetization direction A enters the GMR elements R2 and R3 in the element forming region 12.

As such, in the bridge circuit, resistance values of the GMR elements R1 and R4 and resistance values of the GMR elements R2 and R3 vary into opposite symbols, respectively. For example, the resistance values of the GMR elements R1 and R4 vary by $+\Delta R$, and the resistance values of the GMR elements R2 and R3 vary by $-\Delta R$. Thereby, the differential voltage between the connecting points Va and Vb becomes larger, so that a large differential voltage value can be detected. It should be noted that a circuit which detects a differential voltage is formed on the substrate B, and by being connected with the bridge circuit formed on the GMR chip 10, the differential voltage can be detected.

As described above, accuracy of detecting a magnetic field can be improved by using the magnetic sensor of the above-described configuration. As a result, magnetic sensors can be used for various measurement devices. In particular, as a bridge circuit can be formed on a single chip in the present embodiment, resistance values of respective GMR elements can be reduced, whereby accuracy of detecting the magnetic field can be further improved by suppressing an offset voltage in the bridge circuit. In addition, as the GMR elements constituting the bridge circuit are formed not on a plurality of divided chips but on a single chip, the size of the chip can be reduced as a whole. Thereby, the manufacturing efficiency of the chip is also improved, leading to reduction in the sensor costs.

[Manufacturing Method]

Next, a method of manufacturing the magnetic sensor 1 will be described. First, the four GMR elements R1, R2, R3, and R4 are formed on the GMR chip 10 so as to be arranged on the respective element forming regions 11 and 12 to thereby constitute a bridge circuit (first step). Then, the magnetic body 21 is disposed on the GMR chip 10 at a position between the respective element forming regions 11 and 12 (second step). It should be noted that the GMR chip 10 is arranged on a substrate and various wires are connected at any timing, if necessary.

The magnetic sensor 1 can be manufactured through these steps, and may be used as a measurement device of any type by its own or by being incorporated into another configuration.

<Second Embodiment>

Next, a second embodiment of the present invention will be described with reference to FIGS. 8 and 9.

Figure 8:
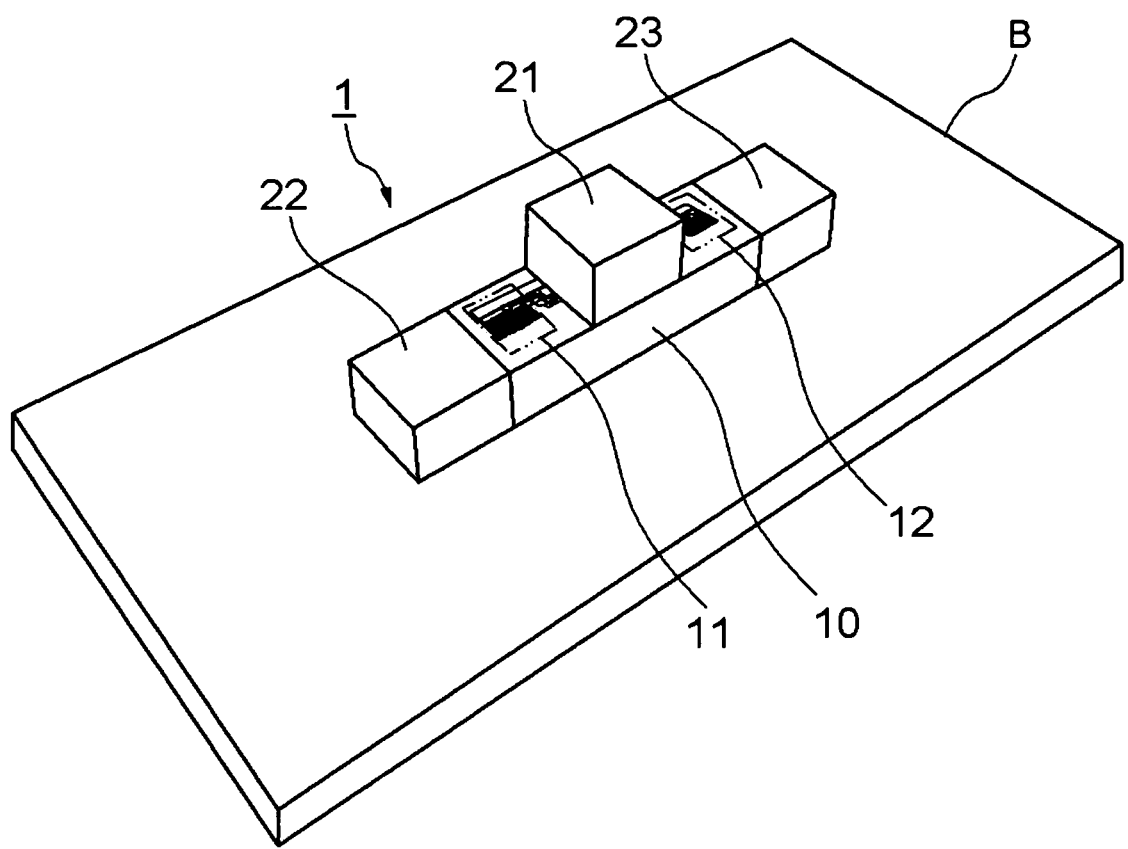
FIG. 8 is a diagram showing the configuration of a magnetic sensor according to a second embodiment.
Figure 9:
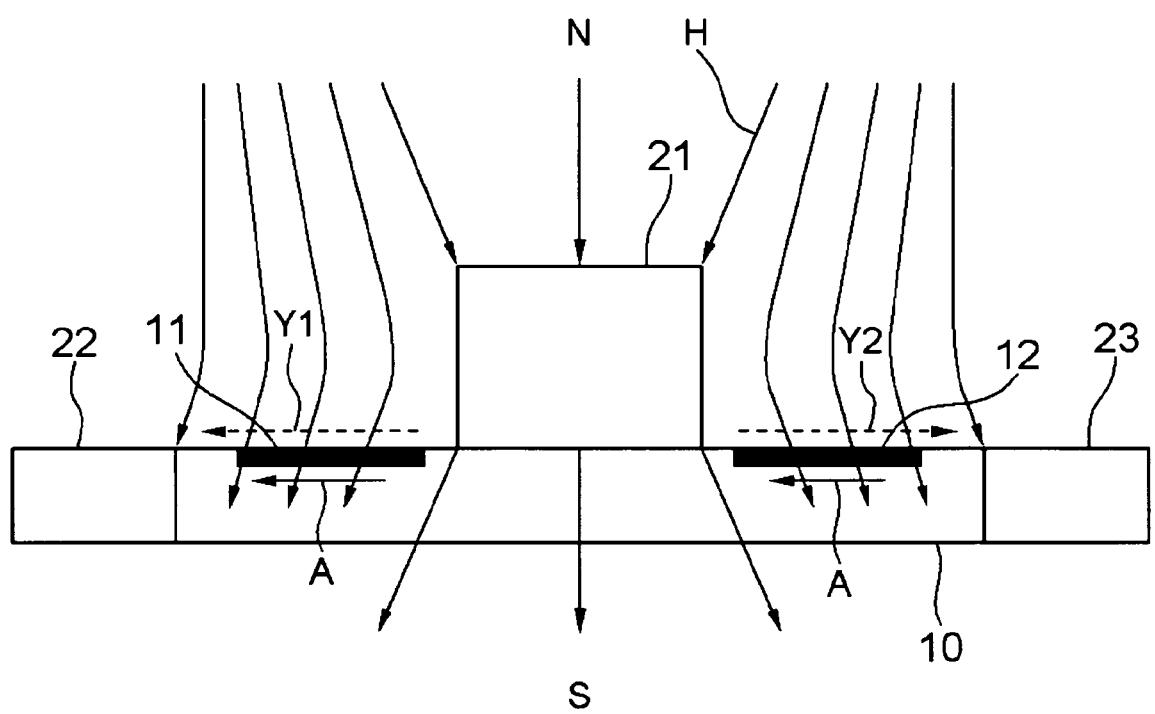
FIG. 9 is a diagram showing a state of a magnetic field relative to the magnetic sensor of the second embodiment.

As shown in FIG. 8, a magnetic sensor 1 of the present embodiment includes two other magnetic bodies 22 and 23 (e.g., soft ferrite (soft magnetic material)), in addition to the magnetic body 21 disposed on the GMR chip 10 in the first embodiment. Specifically, the magnetic bodies 22 and 33 are arranged on both end sides of the GMR chip 10, that is, outside the respective element forming regions 11 and 12. In other words, the magnetic bodies 22 and 23 are respectively arranged at one end of the GMR chip 10 opposite to the element forming region 12 side, and at the other end of the GMR chip 10 opposite to the element forming region 11 side. Thereby, the magnetic bodies 22 and 23 are arranged below the surface on which the GMR elements R1, R2, R3, and R4 are formed in the respective element forming regions 11 and 12.

[Operation]

Next, operation of the magnetic sensor 1 of the above-described configuration will be described with reference to FIG. 9. FIG. 9 shows a case where the magnetic sensor 1 is arranged in the magnetic field H, the direction of which is almost perpendicular to the surface on which the GMR sensors R1, R2, R3, and R4 are formed, as the example of FIG. 7. In the part from almost the center of the magnetic body 21 to the lower part where the element forming regions 11 and 12 are formed, the magnetic field H is bent in a direction away from the magnetic body 21 in the same manner as described above, and drawn to the respective magnetic bodies 22 and 23 provided at the both ends of the GMR chip 10. Accordingly, compared with the first embodiment, the magnetic field H enters the respective element forming regions 11 and 12 (GMR elements (R1 and R4, and R2 and R3)) at greater angles in opposite directions. Specifically, as shown by the arrows Y1 and Y2 of dotted lines in FIG. 9, the magnetic field H in which the direction is changed to the same direction as the fixed magnetization direction A enters the GMR elements R1 and R4 on the element forming region 11, and the magnetic field H in which the direction is changed to the opposite direction to the fixed magnetization direction A enters the GMR elements R2 and R3 on the element forming region 12.

Then, in the bridge circuit, resistance values of the GMR elements R1 and R4 and resistance values of the GMR elements R2 and R3 vary into opposite symbols. For example, the resistance values of the GMR elements R1 and R4 vary by $+\Delta R$, and the resistance values of the GMR elements R2 and R3 vary by $-\Delta R$. Thereby, a difference between the connecting points Va and Vb which are the points of detecting a differential voltage becomes larger, so that a large differential voltage value can be detected. It should be noted that a circuit for detecting a differential voltage is formed on the substrate B, and a differential voltage can be detected by the differential voltage detection circuit on the substrate B being connected with the bridge circuit formed on the GMR chip 10.

As described above, by using the magnetic sensor of the above-described configuration, accuracy of detecting a magnetic field can be improved. As a result, magnetic sensors can be used for various measurement devices. In particular, as a bridge circuit can be formed on a single chip in the present embodiment, variations in resistance values of respective GMR elements can be reduced, so that an offset voltage in the bridge circuit can be suppressed, and accuracy of detecting a magnetic field can be further improved. In addition, as the GMR elements constituting the bridge circuit is formed not on a plurality of divided chips but on a single chip, the size of the chip can be reduced as a whole, whereby the manufacturing efficiency of chip is improved, and the sensor costs can also be reduced.

[Manufacturing Method]

A manufacturing method of the above-described magnetic sensor 1 is the same as that of the first embodiment. That is, the four GMR elements R1, R2, R3, and R4 constituting the bridge circuit are formed on the GMR chip 10 (first step). Then, the magnetic bodies 21, 22, and 23 are arranged on the GMR chip 10 and at the both ends of the GMR chip 10 (second step). It should be noted that the GMR chip 10 is arranged on the substrate B and respective wires are connected at any timing, if necessary.

<Third Embodiment>

Figure 10:
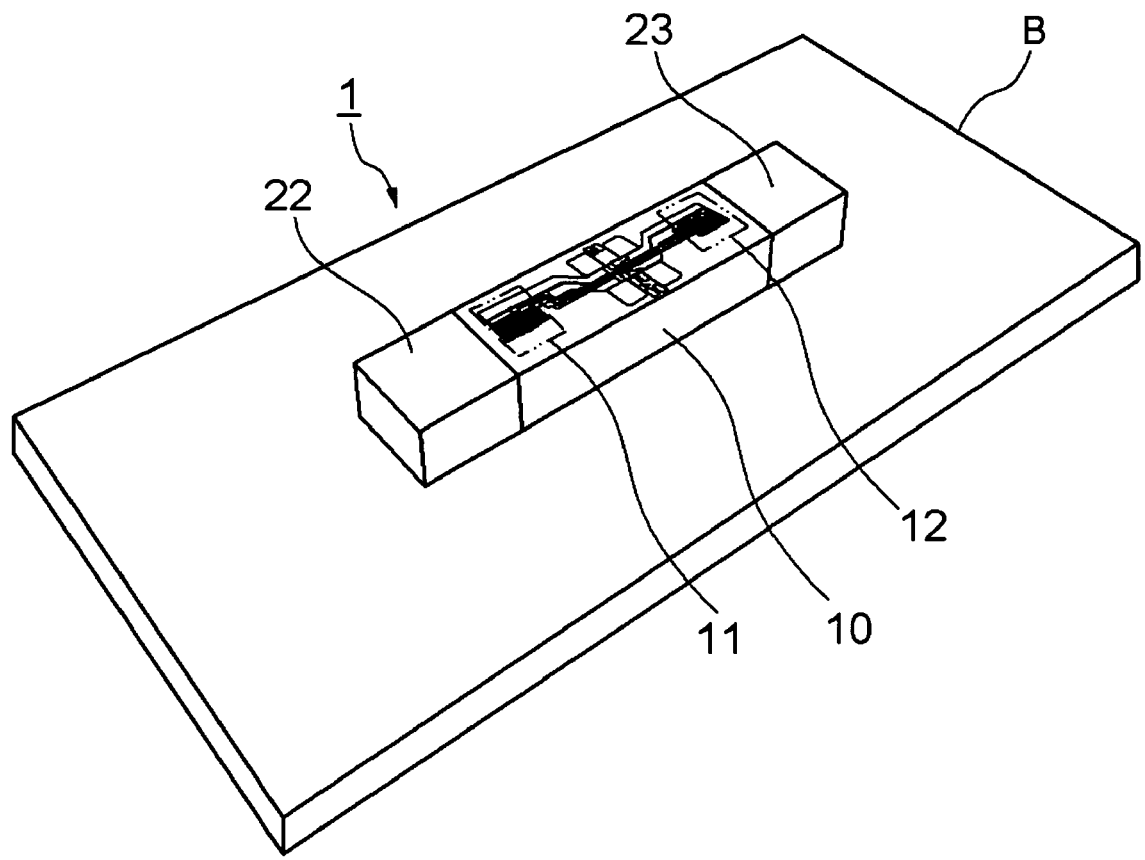
FIG. 10 is a diagram showing the configuration of a magnetic sensor according to a third embodiment.

A third embodiment of the present invention will be described with reference to FIGS. 10 and 11. As shown in FIG. 10, a magnetic sensor 1 of the present embodiment is configured such that the magnetic body 21 arranged on the GMR chip 10 in the first embodiment is not provided but the magnetic bodies 22 and 23 (e.g., soft ferrite (soft magnetic body)) described in the second embodiment are provided on both end sides of the GMR chip 10.

Figure 11:
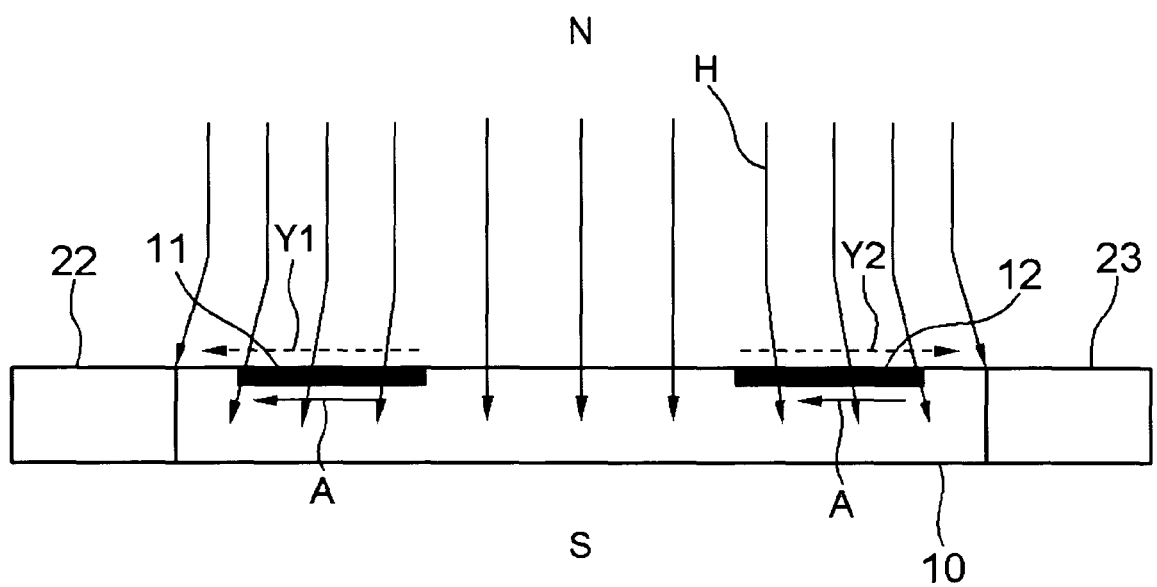
FIG. 11 is a diagram showing a state of a magnetic field relative to the magnetic sensor of the third embodiment.

In this configuration, in the portions where the element forming regions 11 and 12 are formed, the direction of the magnetic field H is changed so as to be drawn to the respective magnetic bodies 22 and 23 formed at both ends of the GMR chip 10, as shown in FIG. 11. Accordingly, the magnetic field H enters the respective element forming regions 11 and 12 (GMR elements (R1 and R4, and R2 and R3)) at angles in opposite directions. More specifically, as shown by the arrows Y1 and Y2 of dotted lines in FIG. 11, the magnetic field H in which the direction is changed to the same direction as the fixed magnetization direction A enters the GMR elements R1 and R4 in the element forming region 11, and the magnetic field H in which the direction is changed to the opposite direction to the fixed magnetization direction A enters the GMR elements R2 and R3 in the element forming region 12.

With this configuration, resistance values of the GMR elements R1 and R4 and resistance values of the GMR elements R2 and R3 vary into opposite symbols in the bridge circuit. For example, the resistance values of the GMR elements R1 and R4 vary by $+\Delta R$, and the resistance values of the GMR elements R2 and R3 vary by $-\Delta R$. Thereby, as a difference between connecting points Va and Vb which are points for detecting a differential voltage becomes larger, a large differential voltage value can be detected. It should be noted that a circuit for detecting a differential voltage is formed on the substrate B, and a differential voltage can be detected by the bridge circuit formed on the GMR chip 1 being connected with the substrate B.

<Fourth Embodiment>

Next, a fourth embodiment of the present invention will be described with reference to FIGS. 12 and 13. In the present embodiment, an ammeter will be described as an example of a measurement device using the magnetic sensor 1.

Figure 12:
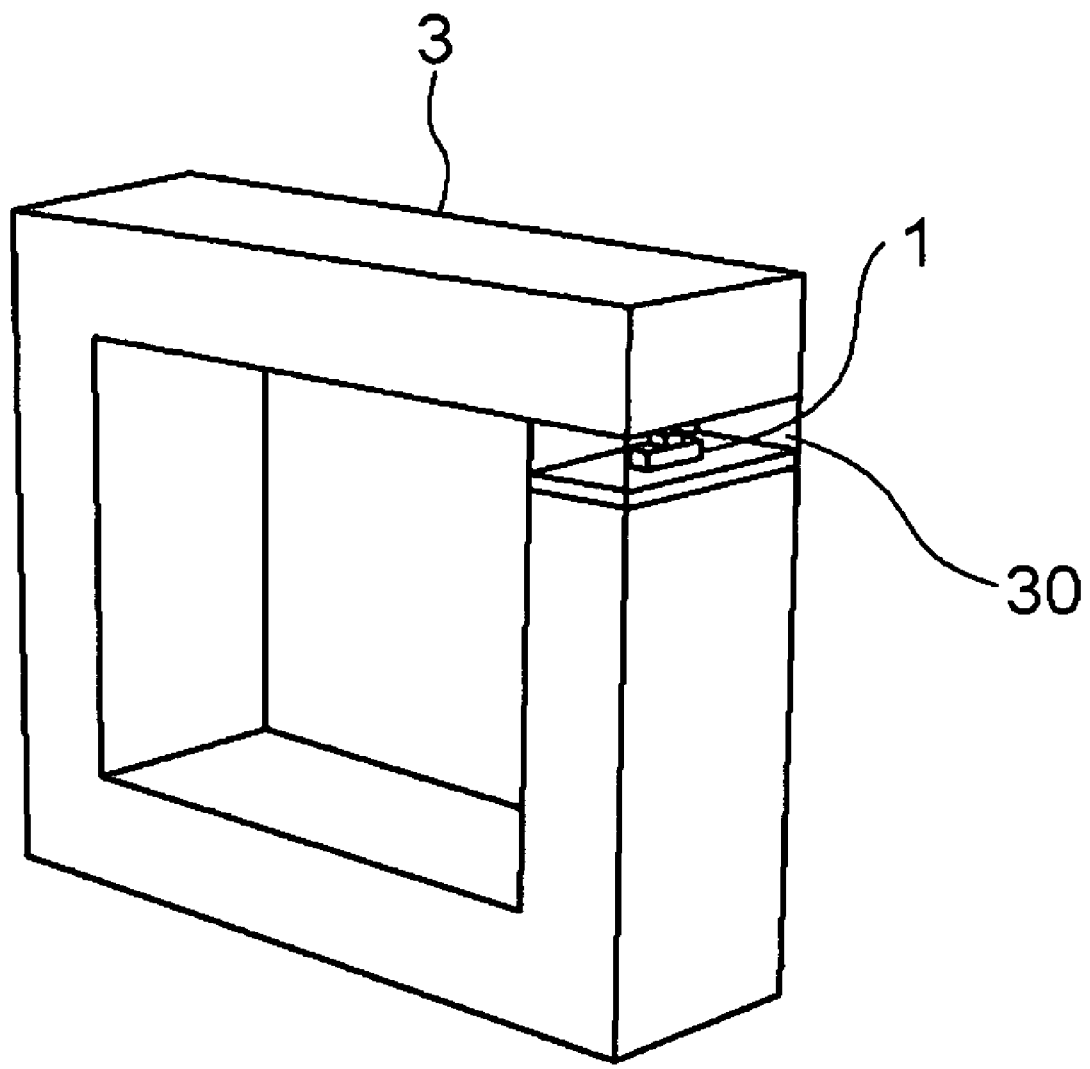
FIG. 12 is a diagram showing the configuration of an ammeter according to a fourth embodiment.
Figure 13:
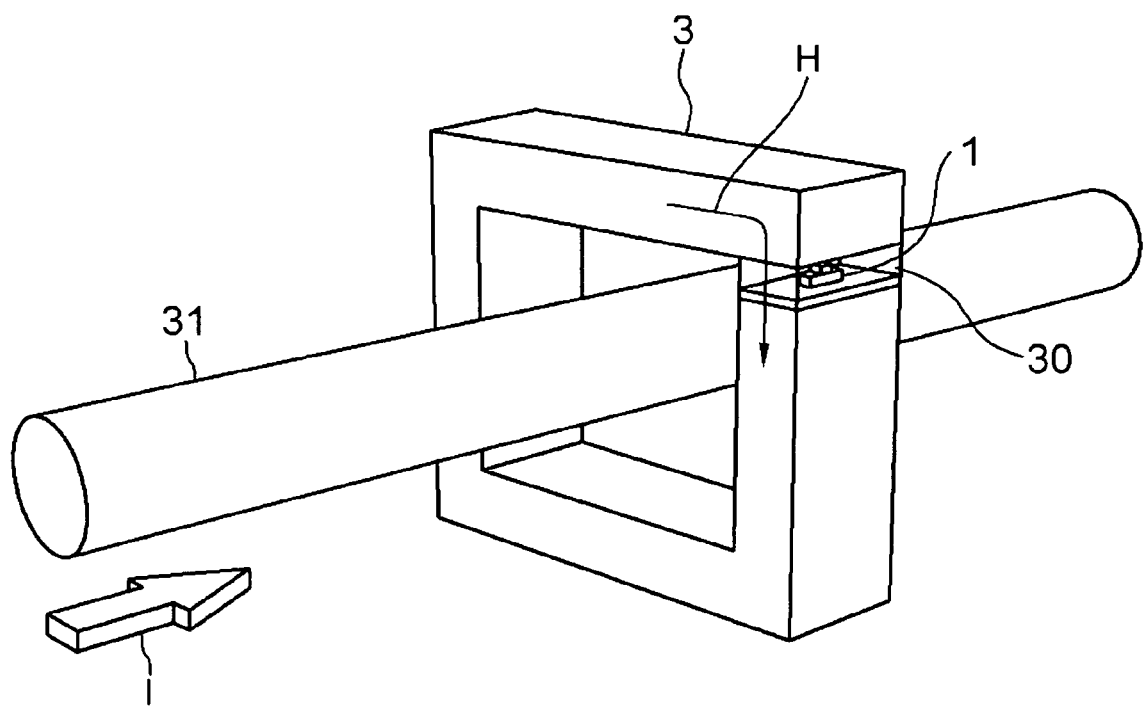
FIG. 13 is a diagram showing the configuration of the ammeter according to the fourth embodiment.

As shown in FIG. 12, the ammeter has a magnetic core 3 in an almost square shape (ring shape) in which a part thereof is cut so as to form a gap 30, and the magnetic sensor 1 described in any one of the first to third embodiments is formed in the gap 30. The magnetic sensor 1 is arranged such that the surface on which the GMR elements R1, R2, R3, and R4 are formed faces a cross section of the magnetic core 3 forming the gap 30, that is, one of the opposite walls forming the gap 30, and a conducting wire 31 (conductor) is arranged so as to penetrate almost the center of the magnetic core 3 in an almost square shape as shown in FIG. 13, and electric current flowing through the conducting wire 31 is measured.

With this configuration, when electric current flows through the conducting wire 31, a magnetic field H circularly generates along the magnetic core 3 surrounding the conducting wire 31. Then, the magnetic field H perpendicularly enters the surface on which the GMR elements R1, R2, R3, and R4 are formed of the magnetic sensor 1 arranged in the gap 30. As such, the conducting wire 31 and the magnetic core 3 work as magnetic field generation means for generating a magnetic field which is to be measured by the magnetic sensor 1.

Then, the magnetic field H generated in the magnetic core 3 by the electric current flowing through the conducting wire 31 is bent, affected by the magnetic body 21 and the like provided to the magnetic sensor 1, as described in the respective embodiments. Thereby, the magnetic field H enters the GMR elements R1, R2, R3, and R4 of the magnetic sensor 1 at predetermined angles. Specifically, the magnetic field H enters the respective element forming regions 11 and 12 (GMR elements (R1 and R4, and R2 and R3)) at angles in opposite directions. Thereby, in the bridge circuit, resistance values of the GMR elements R1 and R4 and resistance values of the GMR elements R2 and R3 vary into opposite symbols. For example, the resistance values of the GMR elements R1 and R4 vary by $+\Delta R$ and the resistance values of the GMR elements R2 and R3 vary by $-\Delta R$. Thereby, as a difference between the connecting points Va and Vb which are points for detecting a differential voltage becomes larger, a large differential voltage value can be detected.

As described above, by using the magnetic sensor 1 having the above-described configuration, electric current flowing through the conducting wire 31 can be detected with high accuracy. In particular, as the bridge circuit is formed on a single chip, variations in resistance values of the respective GMR elements can be reduced. As such, it is possible to suppress an offset voltage so as to further improve accuracy of detecting a magnetic field. In addition, as the GMR elements constituting the bridge circuit is formed not on a plurality of divided chips but on a single chip, the size of the chip can be reduced as a whole. Thereby, the magnetic sensor 1 can be arranged in the small gap 30 of the magnetic core 3, so that it can be applicable to a wide variety of measurement devices.

<Fifth Embodiment>

Next, a fifth embodiment of the present invention will be described with reference to FIGS. 14 and 15. In the present embodiment, an encoder (angle sensor) will be described as an example of a measurement device using the magnetic sensor 1.

Figure 14:
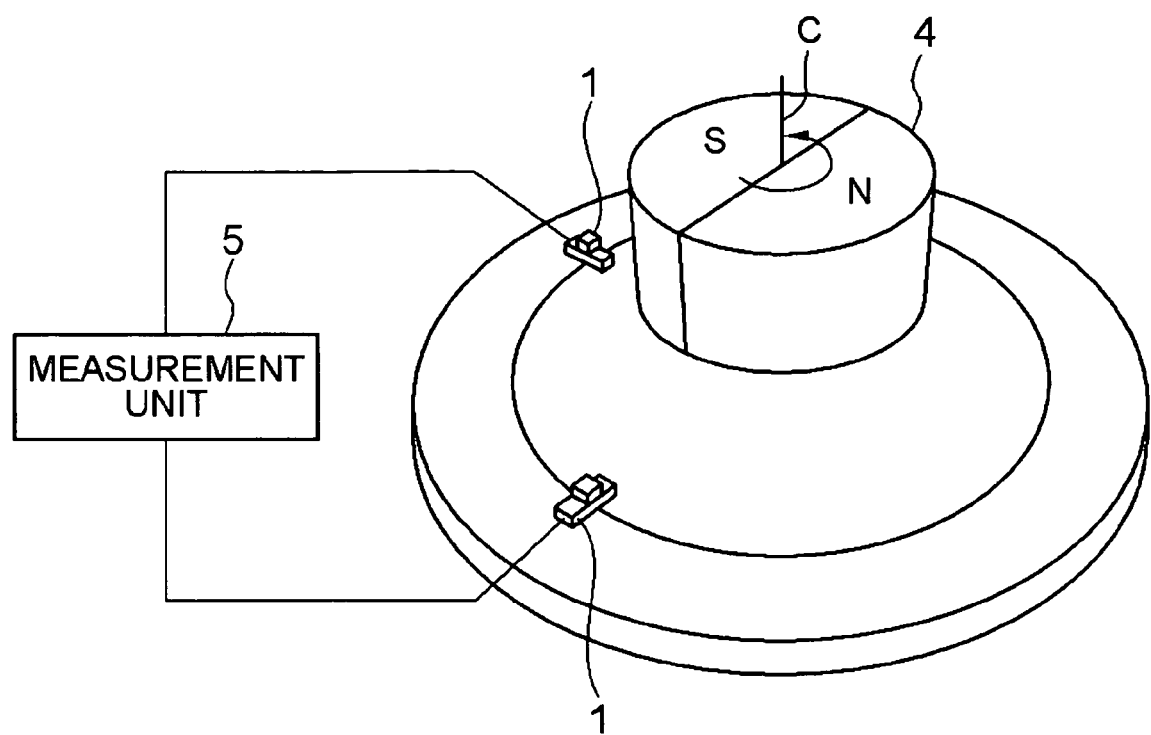
FIG. 14 is a diagram showing the configuration of an encoder according to a fifth embodiment.
Figure 15:
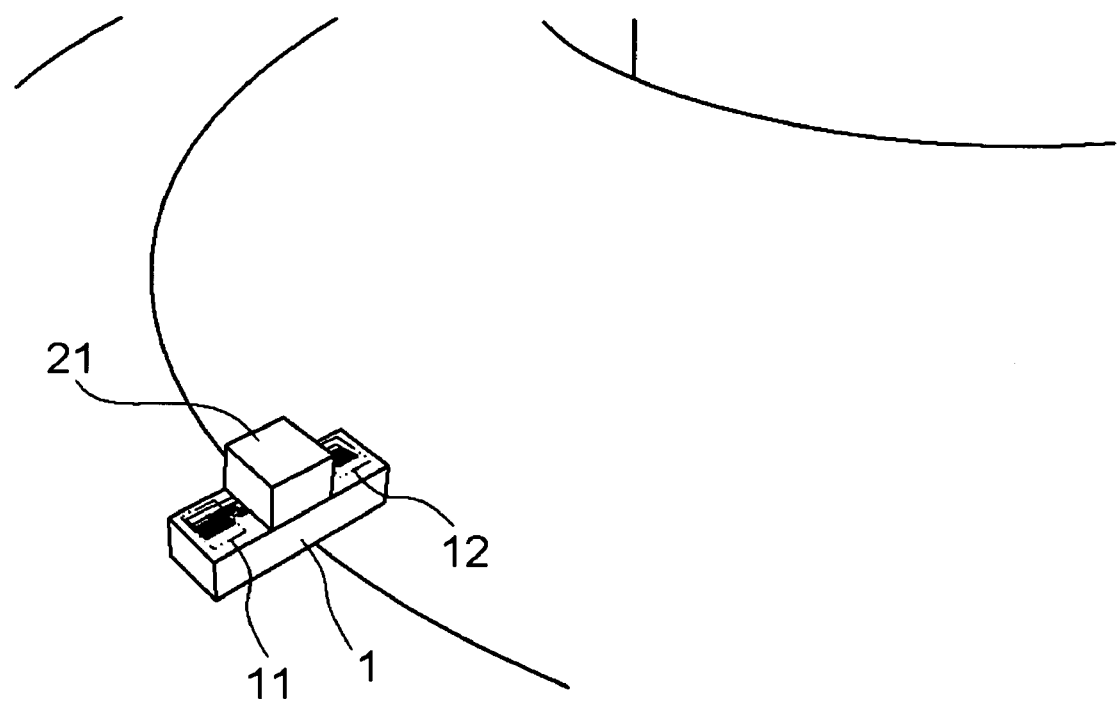
FIG. 15 is a diagram showing the configuration of the encoder according to the fifth embodiment.

As shown in FIG. 14, the encoder has a magnet 4 (magnetic field generation means) in an almost cylindrical shape constituted of semicircular columns of north pole and south pole being combined. The magnet 4 is arranged on a substrate or on a base so as to be rotatable about the center axis of the cylinder, and the magnetic sensors 1 are arranged on the rotational periphery thereof.

Particularly, in the present embodiment, two magnetic sensors 1 are arranged in such a manner that the radius direction of the magnet 4 and the fixed magnetization direction of the GMR elements R1, R2, R3, and R4 coincide with each other. In this embodiment, the two magnetic sensors 1 are arranged at 90 degrees to each other from the center axis of the magnet 4.

With this configuration, when the magnet 4 rotates, the direction of the magnetic field H from the magnet 4 is changed in accordance with the rotation angle, whereby a sine-wave differential voltage value is measured from each magnetic sensor 1. For example, a positive voltage of larger value is obtained as the north pole becomes closer to the magnetic sensor 1, and the voltage becomes zero when the border between the north pole and the south pole faces the magnetic sensor 1, and a negative voltage of smaller value is obtained as the south pole becomes closer to the magnetic sensor 1. As the two magnetic sensors 1 are arranged at 90 degrees to each other, the respective voltage values measured therein have phases shifted by 90 degrees.

Further, the encoder has a measurement unit 5 which is connected with the two magnetic sensors 1 and to which differential voltages measured by the respective magnetic sensors 1 are input. The measurement unit 5 is able to acquire a rotation angle of the magnet 4 by calculating tan from the sin-wave voltage values of different phases measured by the respective magnetic sensor 1, with use of sin and cos. Even in the case where the magnet 4 is at rest, it is possible to calculate a rotation angle of the magnet 4 by calculating tan from outputs of the two magnetic sensors 1 in the same manner. Thereby, the encoder can also work as an absolute encoder.

It should be noted that the configuration in the case of using the magnetic sensor 1 for an encoder is not limited to the above-described configuration. For example, the magnet 4 is not necessarily formed of semicircular columns of north pole and south pole. It is also acceptable that only a half of the outer peripheral surface of the magnet 4 is formed to have a north pole, or only a portion of the outer peripheral surface thereof is formed to have a north pole. Further, the number of the magnetic sensors 1 is not necessarily two. One or three or more magnetic sensors 1 may be arranged.

Further, although an ammeter and an encoder have been described as examples of measurement devices using the magnetic sensors 1, the magnetic sensors 1 of the present invention are applicable to other various measurement devices.

While the present invention has been described with reference to the embodiments, the present invention is not limited to those embodiments. It is understood by those of ordinary skill in the art that various changes in form and details may be made therein within the scope of the present invention.

This application is based upon and claims the benefit of priority from Japanese patent application No. 2008-126621, filed on May 14, 2008, the disclosure of which is incorporated herein in its entirety by reference.

The present invention is applicable to various measurement devices including magnetic sensors, ammeters, and encoders, and has industrial applicability.

What is claimed is:

1. A magnetic sensor comprising:
a bridge circuit including a plurality of magneto resistive effect elements connected with each other, the bridge circuit being capable of detecting a differential voltage between predetermined connecting points, the magneto resistive effect elements outputting resistance values which vary in accordance with a direction of a magnetic field to be input and being arranged such that fixed magnetization directions of the magneto resistive effect elements are in the same direction; and
one or more magnetic bodies arranged in the vicinity of the bridge circuit and changing the direction of the magnetic field to be input to the magneto resistive effect elements,
wherein the bridge circuit includes four magneto resistive effect elements,
wherein two element forming regions, in each of which a pair of the magneto resistive effect elements not adjacently-connected with each other in the bridge circuit are formed in almost the same area, are provided corresponding to respective pairs of the magneto resistive effect elements, and
wherein either (a) the magnetic body is arranged between the two element forming regions, or (b) a plurality of magnetic bodies are respectively provided on an opposite side of one of the element forming regions with respect to the other element forming region, and on an opposite side of the other element forming region with respect to the one element forming region.

2. The magnetic sensor according to claim 1, wherein the magnetic body is made of a soft magnetic material.

3. The magnetic sensor according to claim 1, wherein the magneto resistive effect elements and the magnetic body are arranged on a same straight line along the fixed magnetization direction of the magneto resistive effect elements.

4. The magnetic sensor according to claim 1, wherein the magnetic body is arranged between the two element forming regions and the magnetic body is disposed on a plane where the magneto resistive effect elements are formed.

5. The magnetic sensor according to claim 1, wherein the magnetic body is arranged between the two element forming regions and further comprising additional magnetic bodies respectively provided on an opposite side of one of the element forming regions with respect to the other element forming region, and on an opposite side of the other element forming region with respect to the one element forming region.

6. The magnetic sensor according to claim 5, wherein the additional magnetic bodies are arranged below the plane where the magneto resistive effect elements are formed.

7. A measurement device comprising a magnetic sensor and measuring a predetermined measurement value by detecting a predetermined magnetic field with use of the magnetic sensor, wherein the magnetic sensor includes:
a bridge circuit including a plurality of magneto resistive effect elements connected with each other, the bridge circuit being capable of detecting a differential voltage between predetermined connecting points, the magneto resistive effect elements outputting resistance values which vary in accordance with a direction of a magnetic field to be input and being arranged such that fixed magnetization directions of the magneto resistive effect elements are in the same direction; and one or more magnetic bodies arranged in the vicinity of the bridge circuit and changing the direction of the magnetic field to be input to the magneto resistive effect elements, wherein the bridge circuit includes four magneto resistive effect elements, wherein two element forming regions, in each of which a pair of the magneto resistive effect elements not adjacently-connected with each other in the bridge circuit are formed in almost the same area, are provided corresponding to respective pairs of the magneto resistive effect elements, and wherein either (a) the magnetic body is arranged between the two element forming regions, or (b) a plurality of magnetic bodies are respectively provided on an opposite side of one of the element forming regions with respect to the other element forming region, and on an opposite side of the other element forming region with respect to the one element forming region.

8. The measurement device according to claim 7, further comprising a magnetic field generation unit for generating a magnetic filed which perpendicularly enters a plane where the magneto resistive effect elements provided to the magnetic sensor are formed.

9. An ammeter comprising:
a magnetic core in an almost ring shape having a gap formed by cutting the magnetic core; and
a conductor penetrating through an almost center of the magnetic core, wherein
the ammeter measures electric current flowing through the conductor by detecting a magnetic field generated by the electric current in the magnetic core, and
a magnetic sensor is arranged in the gap, the magnetic sensor including:
a bridge circuit including a plurality of magneto resistive effect elements connected with each other, the bridge circuit being capable of detecting a differential voltage between predetermined connecting points, the magneto resistive effect elements outputting resistance values which vary in accordance with a direction of a magnetic field to be input and being arranged such that fixed magnetization directions of the magneto resistive effect elements are in the same direction; and
a magnetic body arranged in the vicinity of the bridge circuit and changing the direction of the magnetic field to be input to the magneto resistive effect elements.

10. The ammeter according to claim 9, wherein the magnetic sensor is arranged such that a plane where the magneto resistive effect elements provided to the magnetic sensor are formed faces a cross section forming the gap of the magnetic core.

11. A rotation angle sensor, comprising:
a magnetic field generation unit for generating a magnetic field in a predetermined direction; and
a magnetic sensor, wherein
the magnetic sensor includes:
a bridge circuit including a plurality of magneto resistive effect elements connected with each other, the bridge circuit being capable of detecting a differential voltage between predetermined connecting points, the magneto resistive effect elements outputting resistance values which vary in accordance with a direction of a magnetic field to be input and being arranged such that fixed magnetization directions of the magneto resistive effect elements are in the same direction; and one or more magnetic bodies arranged in the vicinity of the bridge circuit and changing the direction of the magnetic field to be input to the magneto resistive effect elements, the magnetic field generation unit is rotatably provided, the magnetic sensor is provided in a rotational periphery of the magnetic field generation unit such that a radius direction of a rotational circle of the magnetic field generation unit and the fixed magnetization direction of the magneto resistive effect element coincide with each other, the bridge circuit includes four magneto resistive effect elements, two element forming regions, in each of which a pair of the magneto resistive effect elements not adjacently-connected with each other in the bridge circuit are formed in almost the same area, are provided corresponding to respective pairs of the magneto resistive effect elements, and either (a) the magnetic body is arranged between the two element forming regions, or (b) a plurality of magnetic bodies are respectively provided on an opposite side of one of the element forming regions with respect to the other element forming region, and on an opposite side of the other element forming region with respect to the one element forming region.

12. The rotation angle sensor according to claim 11, wherein the magneto resistive generation unit is in an almost cylindrical shape, and a half of an outer peripheral face of the magnetic field generation unit is formed to have a north pole.

13. The rotation angle sensor according to claim 12, wherein at least two of the magnetic sensors are arranged in a rotational periphery of the magnetic field generation unit so as to have an angle of 90 degrees between the magnetic sensors from the center of rotation of the magnetic field generation unit.

14. A method of manufacturing a magnetic sensor, the method comprising:
forming a bridge circuit including a plurality of magneto resistive effect elements connected with each other, the bridge circuit being capable of detecting a differential voltage between predetermined connecting points, the magneto resistive effect elements outputting resistance values which vary in accordance with a direction of a magnetic field to be input and being arranged such that fixed magnetization directions of the magneto resistive effect elements are in the same direction; and
arranging one or more magnetic bodies in the vicinity of the bridge circuit, the one or more magnetic bodies changing the direction of the magnetic field to be input to the magneto resistive effect elements,
wherein when forming the bridge circuit, the bridge circuit is constituted of four of the magneto resistive effect elements, and two element forming regions, in each of which a pair of the magneto resistive effect elements not adjacently-connected with each other in the bridge circuit are formed in almost the same area, are provided corresponding to respective pairs of the magneto resistive effect elements, and
wherein either (a) one magnetic body is arranged between the two element forming regions, or (b) a plurality of the magnetic bodies are respectively arranged on an opposite side of one element forming region with respect to another element forming region, and an opposite side of the other element forming region with respect to the one element forming region.

15. The method according to claim 14, wherein one magnetic body is arranged between the two element forming regions, and when arranging the magnetic body, additional magnetic bodies are respectively arranged on an opposite side of one of the element forming regions with respect to the other element forming region, and on an opposite side of the other element forming region with respect to the one element forming region.

* * * * *